US011538741B2

(12) United States Patent
Romig et al.

(10) Patent No.: US 11,538,741 B2
(45) Date of Patent: Dec. 27, 2022

(54) MULTI-CHIP MODULE LEADLESS PACKAGE

(71) Applicant: Texas Instruments Incorporated, Dallas, TX (US)

(72) Inventors: Matthew David Romig, Allen, TX (US); Wei Zhang, Plano, TX (US); Mohammad Waseem Hussain, Irving, TX (US); Peter Anthony Fundaro, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 130 days.

(21) Appl. No.: 17/177,910

(22) Filed: Feb. 17, 2021

(65) Prior Publication Data
US 2021/0257282 A1 Aug. 19, 2021

Related U.S. Application Data

(60) Provisional application No. 62/977,539, filed on Feb. 17, 2020.

(51) Int. Cl.
*H01L 23/495* (2006.01)
*H01L 21/50* (2006.01)
(Continued)

(52) U.S. Cl.
CPC ........ *H01L 23/49558* (2013.01); *H01L 21/50* (2013.01); *H01L 23/4951* (2013.01);
(Continued)

(58) Field of Classification Search
CPC ............... H01L 23/49558; H01L 21/50; H01L 23/4951; H01L 25/0655; H01L 23/28;
(Continued)

(56) References Cited

U.S. PATENT DOCUMENTS 8,633,506 B2 * 1/2014 Kobayakawa ........ H01L 23/488
257/E33.059
9,105,391 B2 * 8/2015 Fouquet .............. H04L 25/0266
(Continued)

OTHER PUBLICATIONS

Analog Devices, Inc., "ADUM7223," https://www.analog.com/en/products/adum7223.html, 1995-2021, 10 pgs., Analog Devices, Inc., USA.
(Continued)

*Primary Examiner* — Eduardo A Rodela
(74) *Attorney, Agent, or Firm* — Ronald O. Neerings; Frank D. Cimino

(57) ABSTRACT

A multi-chip module (MCM) package includes a leadframe including half-etched lead terminals including a full-thickness and half-etched portion, and second lead terminals including a thermal pad(s). A first die is attached by a dielectric die attach material to the half-etched lead terminals. The first die includes first bond pads coupled to first circuitry configured for receiving a control signal and for outputting a coded signal and a transmitter. The second die includes second bond pads coupled to second circuitry configured for a receiver with a gate driver. The second die is attached by a conductive die attach material to the thermal pad. Bond wires include die-to-die bond wires between a portion of the first and second bond pads. A high-voltage isolation device is between the transmitter and receiver. A mold compound encapsulates the first and the second die.

20 Claims, 6 Drawing Sheets

(51) Int. Cl.
  *H01L 25/065* (2006.01)
  *H02M 3/158* (2006.01)
  *H01L 25/16* (2006.01)

(52) U.S. Cl.
  CPC .. *H01L 23/49513* (2013.01); *H01L 23/49548* (2013.01); *H01L 25/0655* (2013.01); *H01L 25/16* (2013.01); *H02M 3/1584* (2013.01)

(58) Field of Classification Search
  CPC . H01L 23/31; H01L 23/3107; H01L 23/3114; H01L 23/367; H01L 23/3675; H01L 23/49; H01L 23/495; H01L 23/49503; H01L 23/49513; H01L 23/4952; H01L 23/49541; H01L 23/49548; H01L 23/49568; H01L 23/49575; H01L 23/49579; H01L 25/072; H01L 25/16; H02M 3/1584
  See application file for complete search history.

(56) References Cited

U.S. PATENT DOCUMENTS

| | | | |
|---|---|---|---|
| 2012/0168901 A1* | 7/2012 | Santangelo | H01L 23/5227 438/107 |
| 2019/0131682 A1* | 5/2019 | Cook | G02B 6/12004 |
| 2019/0206812 A1* | 7/2019 | Bonifield | H01L 24/48 |
| 2020/0211934 A1* | 7/2020 | Ko | H01L 24/49 |
| 2022/0029043 A1* | 1/2022 | Lum | H01L 31/173 |

OTHER PUBLICATIONS

Silicon Laboratories Inc., "Si823x Data Sheet," https://www.silabs.com/documents/public/data-sheets/Si823x.pdf, 2021, 58 pgs., Rev. 2.15, http://www.silabs.com, USA.

Texas Instruments, "UCC21225A 4-A, 6-A, 2.5-kVRMS Isolated Dual-Channel Gate Driver in LGA datasheet (Rev. A)," https://www.ti.com/product/UCC21225A, 1995-2021, pp. 1-8, Texas Instruments, USA.

* cited by examiner

US 11,538,741 B2

MULTI-CHIP MODULE LEADLESS PACKAGE

CROSS-REFERENCE TO RELATED APPLICATION

This application claims the benefit of Provisional Application No. 62/977,539, entitled "Architecture, circuit, and structure for input-to-output and channel-to-channel isolation in a thermally-enhanced leadless package", filed Feb. 17, 2020, which is herein incorporated by reference in its entirety.

FIELD

This Disclosure relates to multi-chip modules including a transmit (Tx) die and a receive (Rx) die having die-to-die bonding, also including a high-voltage (HV) isolator between the respective die.

BACKGROUND

Some packaged semiconductor devices comprise a multi-chip module (MCM) package which includes two or more IC die within the package. Electrical connections between the respective IC die when laterally positioned on die pads within a MCM generally include bond wires connecting to inner located bond pads on the respective IC die including die-to-die bond wires. One known MCM arrangement is a Small Outline Integrated Circuit (SOIC) package.

One MCM package arrangement known as a digital isolator comprises a first IC die and a second IC die generally including communication channels including a Tx die and a Rx die, where some bond pads on the respective die are coupled together by bond wires, and at least one of the die includes at least one high voltage isolation (HV ISO) device, such as a HV capacitor, connected in series in the data channel path. This arrangement enables modulated data signals generated on the Tx die to be passed to the Rx die, but blocks high voltage (e.g., 500 or 1,000 volts during a surge) applied to the active circuitry on the Rx die when in its application from reaching the active circuitry on the Tx die.

Some circuits, such as DC/DC telecom power modules, include what is referred to as brick isolation, are configured with MCMs that involve a Tx die configured for receiving a control signal (such as a pulse width modulation (PWM) signal received from a microcontroller unit (MCU)) and at least one Rx die including a receiver with a gate driver configured for driving gates of power transistors (e.g. insulated gate bipolar transistors (IGBTs) or metal oxide field-effect transistors (MOSFETs)) to support two gate drive channels, or there is a first and a second Rx die each supporting one channel. There is at least one HV ISO device, also called a digital isolator, such as HV ISO device comprising a HV capacitor in the signal path between the Tx die and the Rx die for each channel. A DC/DC telecom brick module is an end application example that includes a digital isolator. The digital isolator employed in an isolated DC/DC telecom brick module is typically realized as an MCM package. In operation of the DC/DC telecom brick module, the transmitter transmits control signals across the digital isolator to the receiver.

Such DC/DC telecom brick modules generally include a spacing from the Tx die (as an input circuit) to the Rx die (as an output circuit), as well as between the respective channels (such as between a first channel and a second channel) that are minimized to the extent possible to reduce the DC/DC telecom brick module's size but to still remain sufficient to meet reliability considerations associated with high electric fields. Such DC/DC telecom brick modules are configured to operate with the Rx die connected to a DC voltage input, where the HV ISO device protects the Tx die from high voltage transients that may occur on the DC voltage input, and where the DC/DC telecom brick module is configured to operate at a high frequency and over a wide ambient temperature range.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize for MCM applications, such as for DC/DC telecom brick modules including a Tx and signal coding die (referred to herein as a "Tx/signal coding die") and a Rx and driver die (referred to herein as a "Rx/driver die"), having a HV ISO device in between, the maximum isolation requirement may be a 2.25 kV DC withstand voltage with at least 1.3 mm of creepage and clearance distance between the lead terminals (also referred to as pins) of the Tx/signal coding die. The Tx/signal coding die is generally on one side of the MCM package and the Rx/driver die is on an opposite side of the MCM package. As these applications strive for higher power density, the DC/DC telecom brick module size needs to decrease.

A smallest dual (two channel)-isolated gate driver for the Rx/driver die may be designed for high working voltages (e.g., >>48V) in a 5 mm×5 mm package with greater than a 3.5 kV DC withstand voltage between the input and the output lead terminals and 3.5 mm of spacing between the input and output terminals. The high working voltage and withstand voltage need a large spacing between the lead terminals of the Tx/signal coding die and the Rx/driver die, which leaves little or no room for exposed relatively large area "thermal pads", also known as power pads, needed for cooling the Rx/driver die during its operation to enable it to operate at higher frequency and temperature, especially at relatively small package sizes.

Disclosed aspects provide a MCM leadless package (MCM package) include a Tx/signal coding die and at least one Rx/driver die including some die-to-die wire bonding, also including a HV isolator device in a signal path between the Rx/driver die and the Tx/signal coding die. Disclosed MCM packages comprise a leadless leadframe having a plurality of lead terminals including at least one thermal pad for enabling a direct thermal connection to a PCB which may be mounted below using a volume under the Rx/driver die to enable higher power dissipation. Also enabled is an increased external Tx/signal coding die to Rx/driver die creepage distance for helping with the isolation requirement by placing the Tx/signal coding die (that has a relatively low power dissipation) onto lead terminals that have half-etched distal portions referred to herein as half-etched lead terminals that because of the half-etching have a reduced externally exposed (from the mold compound) length.

Disclosed MCM packages comprise a leadframe comprising half-etched lead terminals including a full-thickness portion and half-etched portion, and a second lead terminal including a thermal pad(s). A first die is attached by a dielectric die attach material to the half-etched lead terminals. The first die includes first bond pads coupled to first circuitry configured for receiving a control signal and for outputting a coded signal and a transmitter. The second die includes second bond pads coupled to second circuitry configured for a receiver with a gate driver. The second die is attached by a conductive die attach material to the thermal pad. Bond wires include die-to-die bond wires between a portion of the first bond pads and the second bond pads. A high-voltage isolation device is between the transmitter and receiver. A mold compound encapsulates the first die and the second die.

BRIEF DESCRIPTION OF THE DRAWINGS

Reference will now be made to the accompanying drawings, which are not necessarily drawn to scale, wherein.

DETAILED DESCRIPTION

Figure 1A:
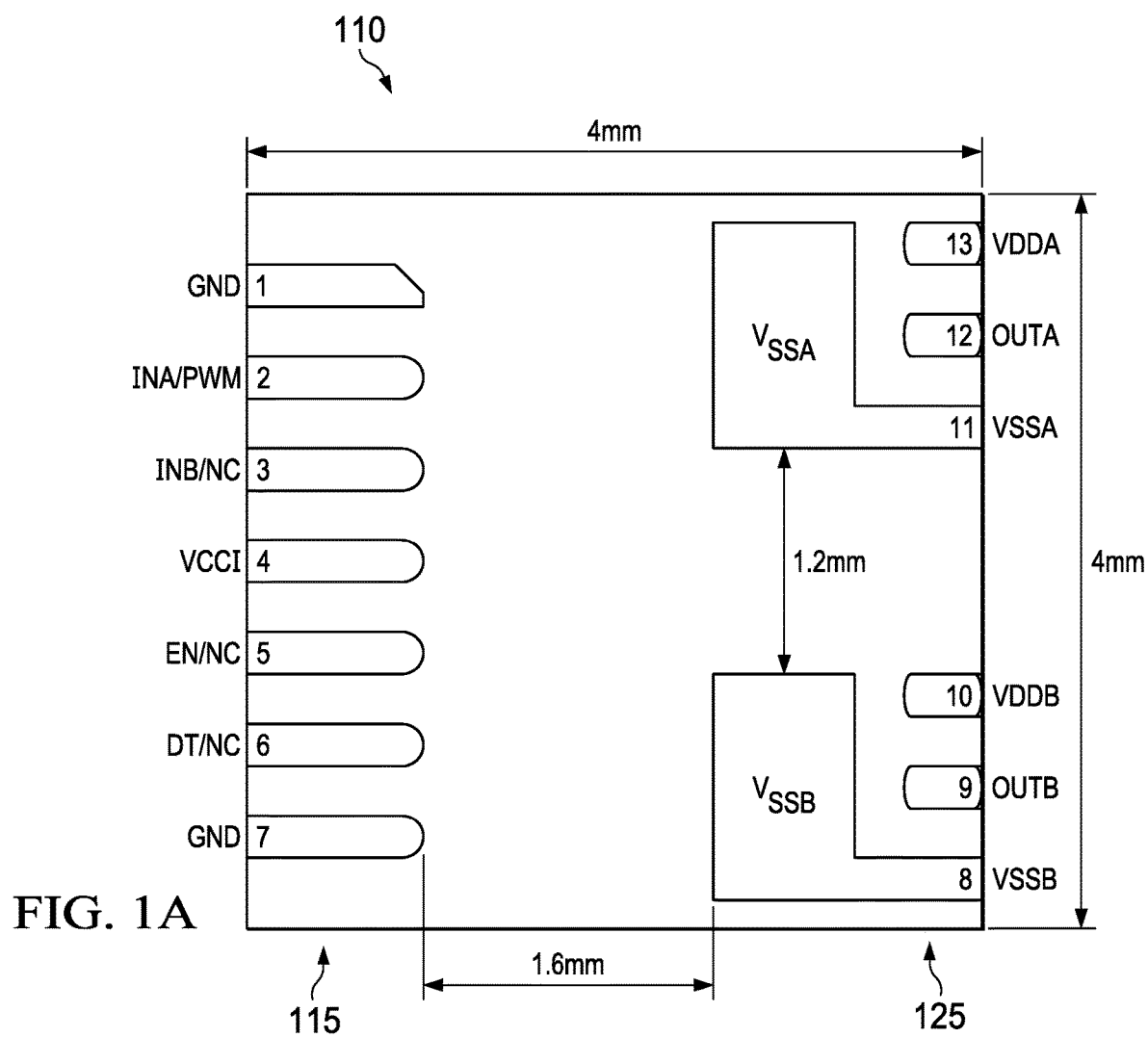
FIG. 1A is a top view depiction of a disclosed small outline no leads (SON) leadframe for a MCM package configured for receiving on an input side a Tx/signal coding die, and receiving on an output side including a first Rx/driver die and a second Rx/driver die, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1A is a top view depiction of a disclosed leadframe shown as a SON leadframe 110 for a MCM package including two channels configured for receiving on an input side a Tx/signal coding die, and on an output side a first $R_X$/driver die as well as second Rx/driver die, along with some examples lead terminal spacings shown, according to an example aspect. The SON leadframe 110 may also be referred to as being a quad flat no lead (QFN) leadframe. The GND terminal is shown having a chamfered corner for visual inspection systems to detect it as the pin 1 corner of the device. The SON leadframe 110 has its pins shown numbered 1 (ground (GND)) to 13 (VDDA).

Also provided is an example pinout along with some examples lead terminal spacings shown. On the input side, there are half-etched lead terminals shown as pins 1 to 7 collectively shown as 115 including an input A (INA/pulse width modulation (PWM)) terminal for controlling the first Rx/driver die and for controlling the second Rx/driver die, such as received from a microcontroller. Although the other input terminal in FIG. 1a INB is shown being a no connect (NC) terminal, the INB terminal can be used for receiving a second PWM signal so that the that first Rx/driver die and the second Rx/driver die are controlled by different control signals.

The half-etched lead terminals 115 also include first and second GND terminals. There is also shown on the input side a VCC terminal shown as VCCI, an enable pin (EN), and a dead time (DT) pin. On the output side shown as pins 8 to 13 there are output side terminals collectively shown as 125 that include for each channel a voltage drain power supply (VDD) terminal, shown as VDDA and VDDB, output (OUT) terminals shown as OUTA and OUTB, and a voltage source supply ($V_{SS}$) terminal for each channel shown as VSSA and VS SB. The VSSA and VSSB terminals can be seen to comprise thermal pads. As used herein the term "thermal pad" is defined to be an exposed lead terminal that comprise a solid metal (generally being copper typically with an optional surface finish for enhanced solderability or bond ability), comprising the same metal as the remainder of the leadframe.

The thermal pad has an area that is larger than the die that is placed thereon in both the X and Y dimension, so that the thermal pad fully encompasses the area of the die from a layout perspective. Additionally, a thermal pad being larger in area as compared to the die that is mounted thereon allows for the use of a liquid epoxy to connect the $R_X$/driver die to the thermal pad. Conventional liquid epoxy materials can be filled with metal particles, such as silver nanoparticles, which provides a substantially higher thermal conductivity as compared to a polymer epoxy material alone.

The SON leadframe 110 is shown having example outer (overall) dimensions of 4 mm by 4 mm, with an example spacing between the distal end of the VSSA and VSSB terminals of the output side lead terminals 125 and the half-etched lead terminals 115 on the input side shown as being 1.6 mm. Also shown as a channel-to-channel spacing defined by a spacing between the VSSA and the VSSB terminals being 1.2 mm. More generally, to support a voltage difference that can be several hundreds of volts between the input side and the output side of a disclosed MCM packaged device during operation during a spike or a transient, an external spacing between the half-etched lead terminals 115 and the VSSA and the VSSB terminals is at least 1 mm and/or is least 30% of a length of an MCM package that utilizes the leadframe 110. Having separate VSS terminals splits the GND plane on the output side into two sections so that each channel has its own ground reference. Ground plane splitting is helpful because in certain applications they are referenced to different voltage nodes. This ground plane splitting can be part of a >200V channel-channel spacing.

Although the SON leadframe 110 is shown having terminals for a first channel (a first Rx/driver die) and a second channel (a second Rx/driver die), for single-channel applications there may be only a single thermal pad. However, a single Rx/driver die may not be able to support multiple channels because the channel-channel voltage of >200V is too high. The lead terminals of the SON leadframe 110, including a disclosed split thermal pad comprising VSSA and the VSSB terminals with a Rx/driver die on each thermal pad, enables meeting the high channel-channel voltage differences when a single Rx/driver die cannot meet this requirement. The half-etched lead terminals 115 may be referred to as being signal pads that support a Tx/signal coding die. The SON leadframe 110 can generally be used for all applications benefiting by the disclosed ability to tailor the leadframe lead terminal spacing to support different levels of voltage differences. Alternate arrangements can set the spacing between lead terminals including the thermal pads as appropriate for particular application requirements.

Figure 1B:
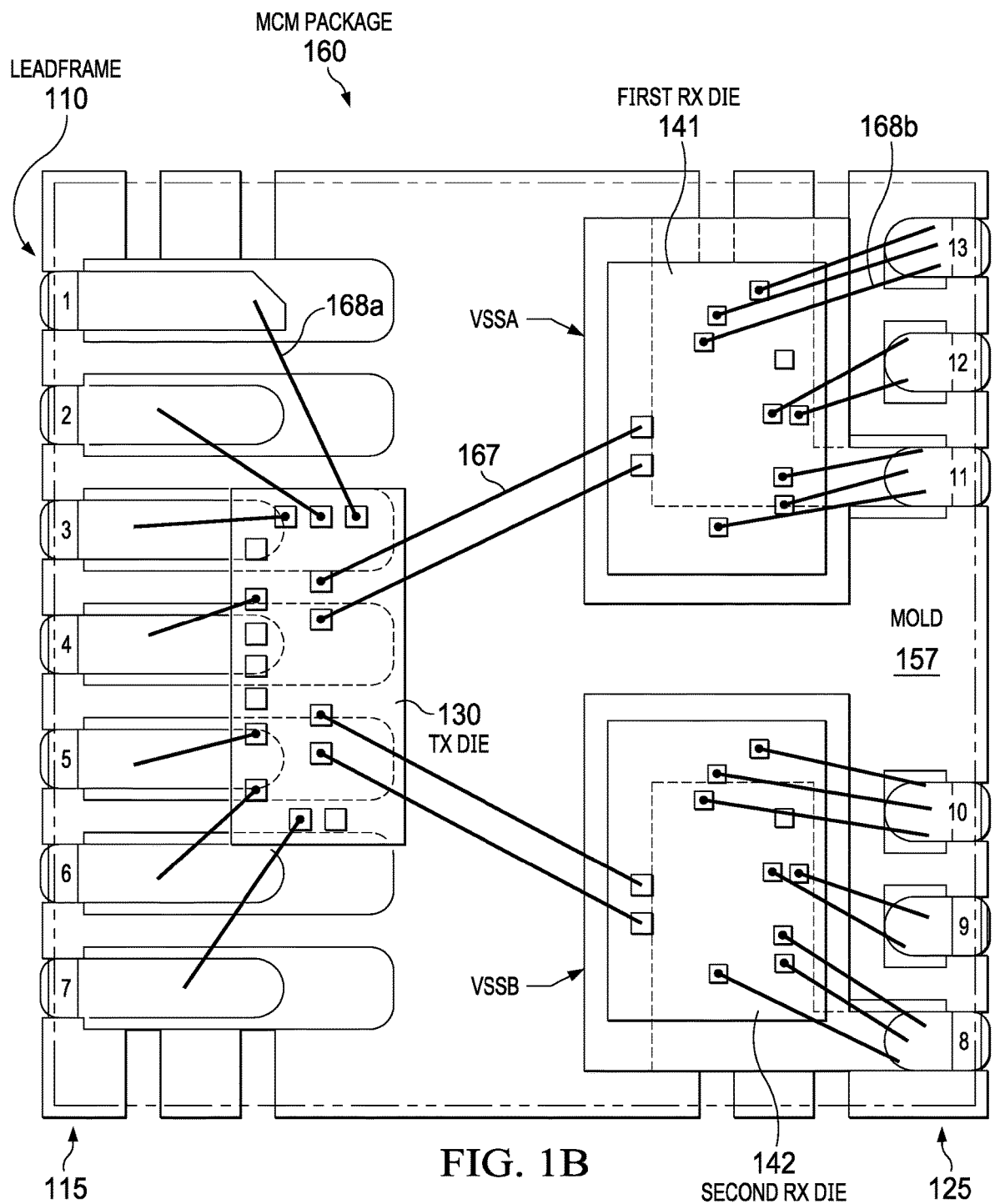
FIG. 1B is a top view depiction of a disclosed MCM package shown in FIG. 1A that now shows bond wire connections along with a Tx/signal coding die and a first Rx/driver die and a second Rx/driver die on the lead terminals of the package.

FIG. 1B is a top view depiction of a disclosed MCM package 160 using the SON leadframe 110 shown in FIG. 1A that now shows a Tx/signal coding die shown as a Tx die 130 on the lead terminals on the input side of the MCM package 160. There is also a first and a second Rx/driver die shown as first Rx die 141 and second Rx die 142 on the lead terminals on the output side of the MCM package 160, as well as bond wire connections. Die-to-die bond wires are shown as 167, and bond wires from the Tx die to any of the half-etched lead terminals are shown as 168a, and the bond wires from any of the Rx die are shown as 168b. The die-to-die bond wires 167 are generally spaced apart between 50 µm and 200 µm. More generally, this spacing may be set to a specific profile to achieve voltage clearance within the MCM package, whereby the voltage potential of the die-to-die bond wires 167 is separated by a sufficient spacing to avoid damage. A mold compound is shown as 157. The respective die 130, 141, and 142 are shown mounted face up with a die attach material underneath (see FIG. 2 described below for example die attach materials).

On the input side, a portion of the Tx/signal coding die 130 sits above a full-thickness portion of the half-etched lead terminals 115 of the SON leadframe 110 and a portion sits above a half-etched portion which is unsupported by metal on its outer side, which is in contrast to conventional chip on lead designs where the die sits across from two separate leads which are fully supported by metal on either side. The half-etched lead terminals 115 can be seen to be all parallel to one another, typical dimensions for the half-etched lead terminals 115 may have a 0.25 mm width, a total length of 1.2 mm, and half-etched length of at least half of the total length, such as being 0.7 mm. As described above, the Tx/signal coding die is generally attached using a non-conductive die attach material, such as a conventional epoxy.

Figure 2:
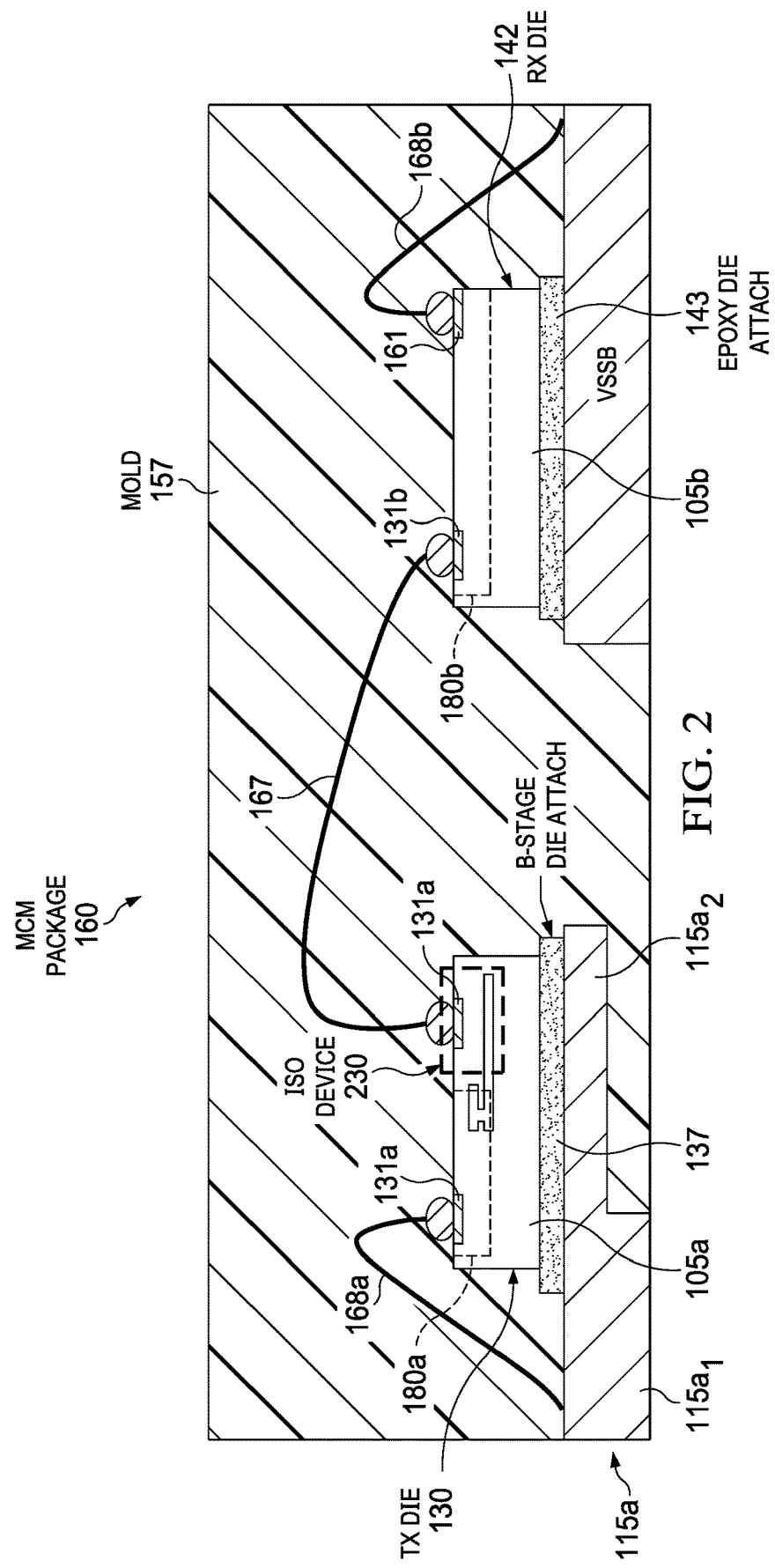
FIG. 2 is a cross-sectional view of the MCM package shown in FIG. 1B. The Tx/signal coding die is now shown on half-etched lead terminals that includes a full-thickness portion and distal half-etched (or cantilever) portion. Half-etched lead terminals provide mechanical support for die placement and bonding, but the half-etched portion is not exposed externally (covered by mold compound) to provide an increased input/output spacing of the lead terminals.

FIG. 2 is a cross-sectional view of the MCM package 160 shown in FIG. 1B taken across a width of the package, but not along a line, to show the VSSB terminal of second Rx die 142 and one of the half-etched lead terminals shown as 115a that includes a full-thickness portion $115a_1$ and a half-etched portion $115a_2$. The Tx die 130 is shown mounted in part on the full-thickness portion $115a_1$, and in another part on the half-etched portion $115a_2$. The half-etched lead terminals have a width and a total length that is generally at least four times the width. Moreover, to as described above help support a higher voltage difference between the input side of the MCM package and an output side of the MCM package, the length of the half-etched portion $115a_2$ is generally at least one half the total length.

A die-to-die bond wire 167 is shown. There is also a bond wire 168a shown between a bond pad 131a on the Tx die 130 a half-etched lead terminal 115a, and a bond wire 168b between a bond pad 161 on the second Rx die 142 and the VSSB terminal.

The second Rx die 142 and the Tx die 130 each comprise a substrate 105a and 105b, such as comprising silicon, including circuitry for each die shown as 180a and 180b having nodes connected to bond pads 131a and 131b, respectively. Circuitry as used herein comprises circuit elements (including transistors, and generally diodes, resistors, capacitors, etc.) formed in a semiconductor region that is configured together for generally realizing at least one circuit function.

The Tx die 130 is now shown with a B-stage die attach material 137 on half-etched lead terminal 115a that includes a full-thickness portion $115a_1$ and distal half-etched portion $115a_2$. A B-stage epoxy film comprises a partially cured versions of traditional epoxy resins. B-stage films can provide the same function as traditional heat-curing epoxies. B-stage films are processed by positioning at the bond interface, and heating to complete the polymerization reaction and bond. B-stage films are typically provided as a film sheet or more often in precut shapes and forms with release liners.

The Rx die 142 is now shown with an epoxy die attach material 143 on a terminal shown as the VSSB terminal. The Tx die 130 is shown by example having an on-chip HV ISO device 230 in its signal path. However, the HV ISO device 230 can also be on the Rx die 142 in the signal path, or on both of these die.

Figure 3:
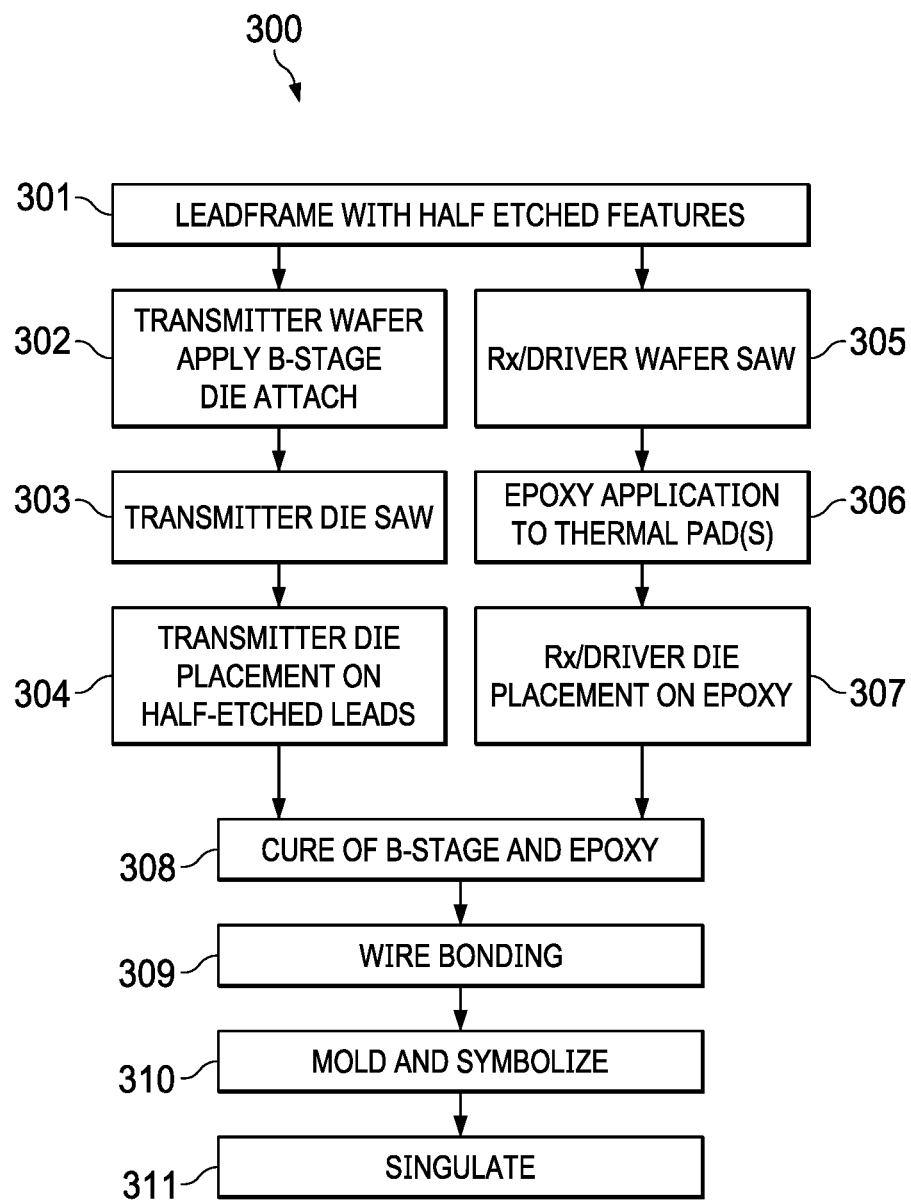
FIG. 3 shows example steps for a first assembly flow for forming a disclosed MCM package, according to example aspect.

FIG. 3 shows an example first assembly flow 300 for forming a disclosed MCM package, according to example aspect. Although not specifically described, disclose assembly flows including first assembly flow 300 generally utilize leadframes that are in a conventional block/array/panel so that many MCM packages can be processed concurrently. Step 301 comprises obtaining a leadframe having lead terminals with half-etched features, such as shown as half-etched lead terminal 115a including a full-thickness portion $115a_1$ and a half-etched portion $115a_2$ in FIG. 2. Step 302 comprises applying a dielectric die attach material shown as a B-stage die attach material (film) to the backside of a Tx/signal coder wafer. Alternatively, the dielectric die attach material may comprise a screen-printed dielectric material. Step 303 comprises sawing a Tx/signal coder wafer to provide a plurality of singulated Tx/signal coder die. Step 304 comprises placement of a Tx/signal coder die top side up on the lead terminals on the input side of a leadframe having half etched lead terminals.

Step 305 comprises sawing a Rx/driver wafer to provide a plurality of singulated Rx/driver die. Step 306 comprises applying a conductive die attach material shown as an epoxy die attach material that generally has having metal particle filling (such as filled with silver particles) to the lead terminals on the output side of the package including on the VSSA terminal and the VSSB terminal (thermal pads). The conductive die attach material is defined herein as a material that provides a 2°5° C. thermal conductivity of at least 1 W/m·K. In contrast, conventional non-thermally conductive die attach materials generally have a 2°5° C. thermal conductivity of about 0.2 to 0.3 W/m·K. The conductive die attach material can comprise a metal particle filled epoxy material, a ceramic, a composite material, solder, or sintered nanoparticles.

Step 307 comprises placement of the Rx/driver die on the epoxy on the lead terminals on the output side of the leadframe. Step 308 comprises curing of the B-stage die attach material and the epoxy die attach material. Step 309 comprises wirebonding, including die-to-die wirebonding. Step 310 comprises molding and generally symbolizing. Symbolizing generally comprises using a laser to ablate the top surface of the package to "write" the part number, the lot code, and other identifying information.

Step 311 comprises package singulation. Disclosed methods including first assembly flow 300 can further comprise applying a pre-tape on a bottom side of the leadframe, and after forming the mold compound removing the pre-tape. The adding of the pre-tape on the bottom side of the leadframe provide additional mechanical stability. The pre-tape is generally removed after molding when the leadframe is more mechanically stable due to the presence of the mold compound.

Figure 4:
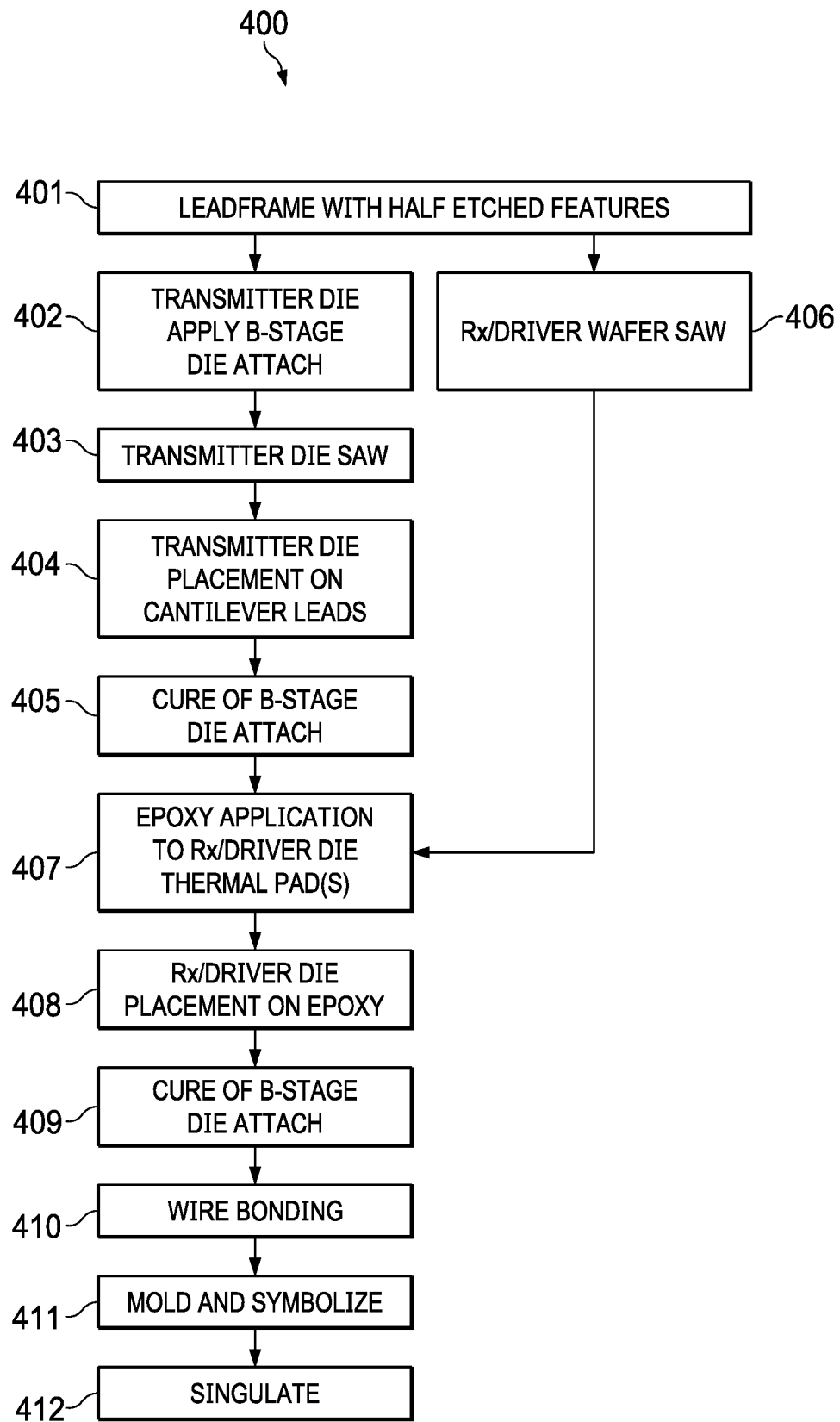
FIG. 4 shows example steps for a second assembly flow for forming a disclosed MCM package, according to example aspect. The second assembly flow differs from the first assembly flow by utilizing separate curing for the B-stage die attach material and the epoxy material. The advantage of the separate curing is that each cure step can be separately optimized for the die attach material selected, and moreover there is less time between placement of the first die and the curing step which can improve the adhesion of the first die attach material.

FIG. 4 shows an example second assembly flow 400 for forming a disclosed MCM package, according to an example aspect. Step 401 comprises obtaining a leadframe having some half-etched features, such as shown in FIG. 2. Step 402 comprises applying a B-stage die attach material to the backside of a Tx/signal coder wafer. Step 403 comprises sawing a Tx/signal coder wafer to provide a plurality of singulated Tx/signal coder die. Step 404 comprises placement of a Tx/signal coder die on the half-etched leads. Step 405 comprises curing the B-stage die attach material.

Step 406 comprises sawing a Rx/driver wafer to provide a plurality of singulated Rx/driver die. Step 407 comprises applying a conductive die attach material shown as an epoxy die attach material that generally has having metal particle filling (such as filled with silver particles) to the lead terminals on the output side of the package including on the thermal pads. Step 408 comprises placement of the Rx/driver die on the output side of the leadframe including on the thermal pads. Step 409 comprises curing of the B-stage die attach material. Step 410 comprises wirebonding including die-to-die wirebonding. Step 411 comprises molding and symbolizing. Step 412 comprises package singulation.

EXAMPLES

Disclosed aspects are further illustrated by the following specific Examples, which should not be construed as limiting the scope or content of this Disclosure in any way.

Figure 5:
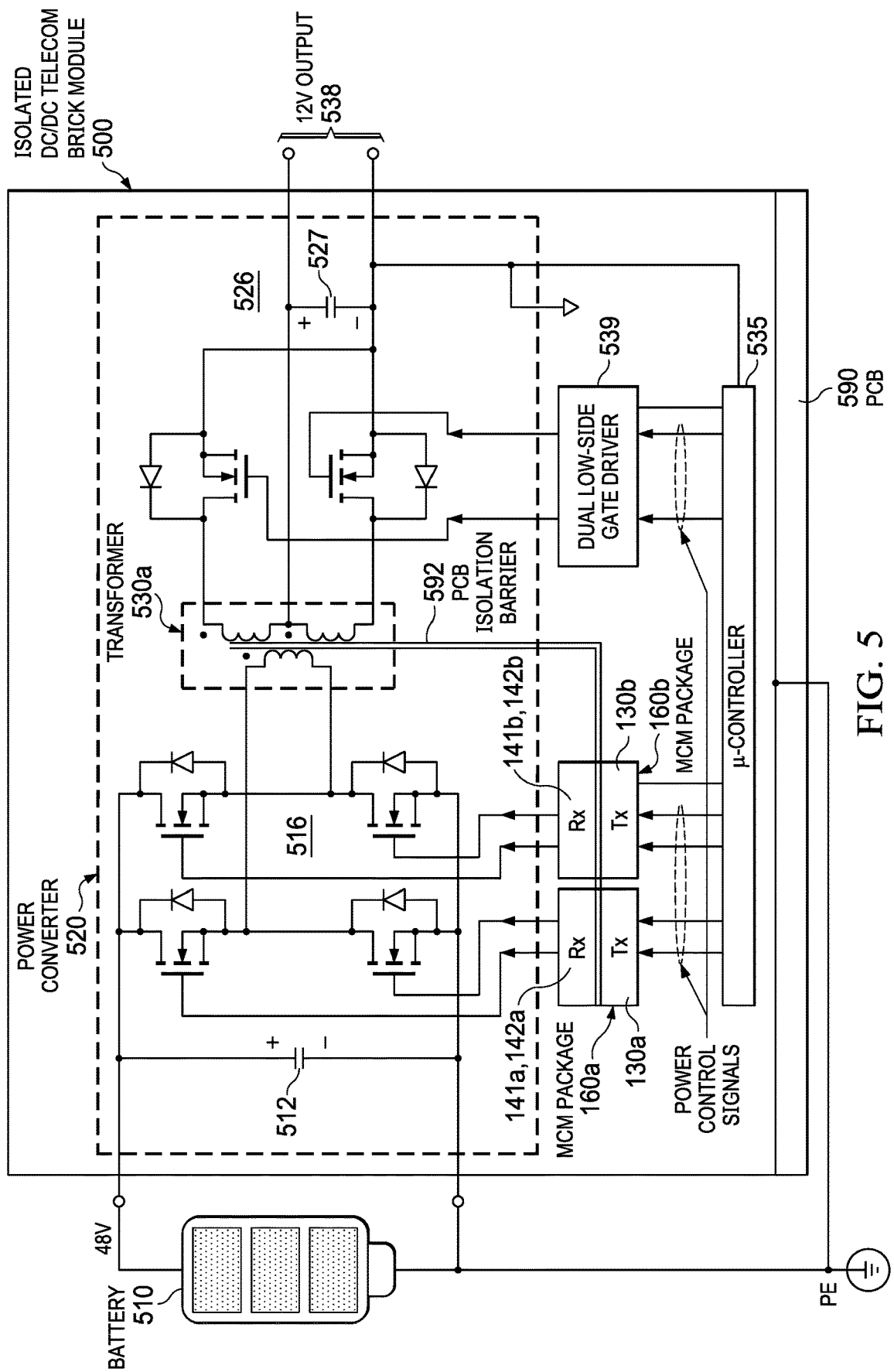
FIG. 5 shows a disclosed MCM package as part of a DC/DC telecom brick power module including a first and a second disclosed MCM package.

FIG. 5 shows an example application for disclosed MCM packages as part of an isolated DC/DC telecom brick module 500 shown implemented on a PCB 590, having DC/DC converter shown as a power converter 520 comprising a converter input side 516 and a converter output side 526 on both sides of a HV ISO device on the PCB 590, shown by example as a transformer 530*a*. There are two MCM packages shown in FIG. 5 as MCM package 160*a* comprising Tx die 130*a* and Rx die 141*a*/142*a*, and MCM package 160*b* comprising Tx die 130*b* and Rx die 141*b*/142*b*. Each Rx die has a receiver with a gate driver that provides a gate driver output shown coupled to the respective gates of the transistors of the converter input side 516. Having the two MCM packages 160*a* and 160*b* is generally needed to collectively drive the four transistors shown in the converter input side 516, which is described in more detail below.

The isolated DC/DC telecom brick module 500 can be used as a 48V brick power supply module for telecommunication systems, which generally require HV isolation up to 2.25 kV DC, input-to-output creepage of at least 1.3 mm, channel-to-channel isolation of at least 100 V, and enhanced cooling by providing low thermal impedance to enable operation under high PCB 590 temperature or high ambient temperature. The PCB 590 is shown having a PCB isolation barrier 592 (e.g., 1.3 mm wide) which separates the converter input side 516 and the converter output side 526, where the PCB isolation barrier 592 is bridged by the transformer 530*a*, and by the MCM packages 160*a*, 160*b*. As described in more detail below, because the MCM packages 160*a*, 160*b* are electrically connected to the converter input side 516 that can experience high voltage surges or transients, for example during a surge/transient at about 1.5 kV, the MCM packages 160*a*, 160*b* both include the HV ISO device 230 shown in FIG. 2. PE shown in FIG. 5 represents a protective earth ground reference.

The converter input side 516 (or primary side) is shown by example including four power MOS devices configured in a full-bridge configuration powered by a battery 510. The converter output side 526 is shown comprising transistors and gate drivers shown as the dual low-side gate driver 539 shown coupled for driving the respective gates of the two transistors on the converter output side 526, where the converter output side 526 may in this case also be called the secondary side. A suitable DC/DC power converter 520 for use together with a disclosed MCM package for system modules such as the isolated DC/DC telecom brick module 500 shown, can be obtained commercially.

The 48V (nominal) voltage shown applied to the transistors on the converter input side 516 is shown provided by a battery 510 that powers the converter input side 516. The converter output side 526 which is on a side of the transformer 530*a* opposite relative to the converter input side 516 is shown having an output at 12V as an example, and is isolated from voltage surges and transients which may occur on the converter input side 516.

The converter output side 526 transistors and other components need to be isolated from the converter input side 516, so that voltage disturbances and transients (e.g., a surge from the 48V battery input lines to PE) received at the converter input side 516 do not affect the converter output side 526 and its connected circuitry. The transformer 530*a* on the PCB 590 (and the HV ISO device 230 in the MCMs) provide the HV isolation to realize the side-to-side isolation for the transient voltages applied to the converter input side 516. The converter output side 526 needs voltage regulation to meet the desired output voltage (in this case the 12V level) at output 538 based on a varying input DC voltage provided by the battery 510 on the converter input side 516 that applies its DC voltage across an input capacitor 512. The converter input side 516 has an output coupled to one side (the primary side) of the transformer 530*a*, where the other side of the transformer 530*a* is coupled to an input of the converter output side 526.

The microcontroller 535 is configured including connections to enable sensing the voltage level at the output 538 that is taken across an output capacitor 527 on the converter output side 526 in response transmitting information in the form of modulated data signals from the Tx input to the Rx output of the MCM packages 160a, 160b from the converter output side 526 to the converter input side 516. The microcontroller 535 thus provides a control signal to each Tx input that commands each Rx output to adjust the duty cycle or frequency of a gate drive voltage applied to gates of the transistors on the converter input side 516 to achieve the desired voltage regulation and best power conversion efficiency. Since signals are transmitted from one side of the transformer 530a (i.e., from the converter output side 526 to the converter input side 516), the MCM packages 160 also needs a HV ISO device as shown in FIG. 2. The microcontroller 535 is also shown coupled to control the dual low-side gate driver 539, where the dual low-side gate driver 539 controls the bias level applied to the gates of the transistors of the converter output side 526.

Since as described above the MCM packages 160a and 160b are also operating (electrically connected to) the nominal 48V converter input side 516 controlling the high side and low side transistors configured in a full bridge configuration, the MCM packages 160a, 160b also need to sufficient terminal-to-terminal spacing from HV terminals (e.g., terminals that touch 48V such as the ground reference for the high-side gate driver output of Rx die 141b connected to the high-side transistor gate) to its low-voltage terminals (e.g., terminals operated at 10-12V potential such as the gate drive supply for the low-side gate driver output of Rx die 142b connected to the low-side transistor gate.

The MCM packages 160a, 160b provide 1.2 mm spacing from one output channel (i.e., the high-side driver ground reference, for example, the output of 141b) connected on the converter input side 516 to the other output channel (i.e., the low-side gate drive supply for, for example, the output of 142b) also connected on the converter input side 516. The MCM packages 160a, 160b can generally meet the following three key requirements for use in modules including a DC/DC power converter, such as the DC/DC power converter 520. These three requirements comprise:
1) voltage transient requirements and lead terminal spacing for input-to-output terminal isolation (for example, 707V, 1.5 kV or 2.25 kVDC for is and 1.3 mm);
2) High-voltage to low-voltage lead terminal spacing of at least 1 mm for the two channels, and
3) thermal pads also called power pads for improved heat dissipation.

Disclosed MCM packages are also 36% smaller in size as compared to the commercially available MCM packages that are believed to only be able to meet requirements 1) and 2).

Junction-to-air thermal resistance ($\theta_{JA}$) is a measure of the ability of a device to dissipate heat from the surfaces of the die to the ambient through all possible paths. Experiments were performed to determine the thermal performance of a MCM package 160 molded with plastic including a Tx/signal coding die, and a first and a second Rx/driver die on a disclosed leadless leadframe including first and second thermal pads. It was found that the inclusion of thermal pads typically reduced the $\theta_{JA}$ of the MCM package by about a factor of two, and the $\psi_{JB}$ (junction-to-board thermal parameter) reduced by about a factor of 6.

Disclosed aspects can be integrated into a variety of assembly flows to form a variety of different MCM packages and related products. Although not shown, the MCM package can also comprise stacked IC die, besides laterally positioned IC die. The IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die can be formed from a variety of processes including bipolar, insulated-gate bipolar transistor (IGBT), CMOS, BiCMOS, and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:
1. A multi-chip module (MCM) package, comprising:
a leadless leadframe including a plurality of lead terminals including a plurality of half-etched lead terminals that include a full-thickness portion and a distally located half-etched portion, and second lead terminals including at least one thermal pad;
a first die attached by a dielectric die attach material to the plurality of half-etched lead terminals, the first die comprising first bond pads coupled to first circuitry including circuit elements configured for receiving a control signal and for outputting a coded signal at a selected frequency, and a transmitter;
at least one second die attached to the second lead terminals, the second die comprising second bond pads coupled to second circuitry including circuit elements configured for a receiver with a gate driver, wherein the second die is attached by a conductive die attach material to the thermal pad;
bond wires including die-to-die bond wires between a portion of the first bond pads and a portion of the second bond pads;
at least one high-voltage isolation device between the transmitter and the receiver, and
a mold compound for encapsulating the first die and the second die.

2. The MCM package of claim 1, wherein the at least one second die comprises the second die and a third die, wherein the at least one thermal pad comprises a first thermal pad and a second thermal pad, and wherein the second die is attached to the first thermal pad and the third die is attached to the second thermal pad.

3. The MCM package of claim 1, wherein the leadless leadframe comprises a small outline no leads (SON) leadframe.

4. The MCM package of claim 3, wherein the plurality of half-etched lead terminals is on a first side of the MCM package, and wherein the second lead terminal portion is on a second side of the MCM package opposite the first side.

5. The MCM package of claim 1, wherein the dielectric die attach material comprises a film lamination, and wherein the conductive die attach material provides a 2°5° C. thermal conductivity of at least 1 W/m·K, and comprises a metal particle filled epoxy material, ceramic, a composite material, solder, or sintered nanoparticles.

6. The MCM package of claim 1, wherein an external spacing between the half-etched lead terminals and the thermal pad is at least one of at least 1 mm and at least 30% of a length of the MCM package.

7. The MCM package of claim 1, wherein the plurality of half-etched lead terminals is parallel to one another, and wherein some of an area of the first die is positioned above the full-thickness portion and another area of the first die is positioned above the half-etched portion.

8. The MCM package of claim 1, wherein the plurality of half-etched lead terminals has a width, and a total length that is at least four times the width, and wherein the half-etched portion is at least one half the total length.

9. The MCM package of claim 1, wherein the high-voltage isolation device comprises a high-voltage transformer or a high-voltage capacitor.

10. A method of assembling a multi-chip module (MCM) package, comprising:
providing a leadless leadframe including a plurality of lead terminals including a plurality of half-etched lead terminals that include a full-thickness portion and a distally located half-etched portion and second lead terminals including at least one thermal pad;
attaching a first die with a dielectric die attach material to the plurality of half-etched lead terminals, the first die comprising first bond pads coupled to first circuitry including circuit elements configured for receiving a control signal and for outputting a coded signal at a selected frequency, and a transmitter;
attaching at least a second die using a conductive die attach material to the thermal pad, the second die comprising second bond pads coupled to second circuitry including circuit elements configured for a receiver with a gate driver;
wherein there is at least one high-voltage isolation device on the first die or on the second die between the transmitter and the receiver;
positioning bond wires including die-to-die bond wires between a portion of the first bond pads and a portion of the second bond pads, and
forming a mold compound for encapsulating the first die and the second die.

11. The method of claim 10, a shared curing step is used for the attaching of the first die and the attaching of the second die.

12. The method of claim 10, where the attaching of the first die comprises a first curing step and the attaching of the second die comprises a separate second curing step.

13. The method of claim 10, wherein the die-to-die bonds wires are spaced between 50 μm and 200 μm.

14. The method of claim 10, further comprising applying a pre-tape on a bottom of the leadless leadframe, further comprising after forming the mold compound removing the pre-tape.

15. The method of claim 10, wherein the at least one second die comprises the second die and a third die, wherein the at least one thermal pad comprises a first thermal pad and a second thermal pad, and wherein the second die is attached to the first thermal pad and the third die is attached to the second thermal pad.

16. The method of claim 10, wherein the dielectric die attach material comprises a film lamination, and herein the conductive die attach material comprises a metal particle filled epoxy material, ceramic, a composite material, solder or sintered nanoparticles.

17. The method of claim 10, wherein the plurality of half-etched lead terminal is parallel to one another, and wherein some of an area of the first die is positioned above the full-thickness portion and another area of the first die is positioned above the half-etched portion.

18. The method of claim 10, wherein the plurality of half-etched lead portions has a width, and a total length that is at least four times the width, and wherein the half-etched portion is at least one half the total length.

19. A telecom module, comprising:
a DC/DC power converter having a converter input side configured for receiving a DC voltage that is applied to an input of a high-voltage isolation device that provides a DC output voltage to a converter output side,
at least one multi-chip module (MCM) package, comprising:
a leadless leadframe including a plurality of lead terminals including on an input side a plurality of half-etched lead terminals that include a full-thickness portion and a distally located half-etched portion, and on an output side second lead terminals including at least one thermal pad having a pad area;
a first die attached by a dielectric die attach material to the plurality of half-etched lead terminals, the first die comprising first bond pads coupled to first circuitry including circuit elements configured as a first receiver for receiving a first control signal and for outputting a coded signal at a selected frequency, and a first transmitter, wherein there is a first on-chip high-voltage isolation device between the first receiver and the first transmitter;
at least one second die attached to the second lead terminals including the thermal pad, the second die comprising second bond pads coupled to second circuitry including circuit elements configured as a second receiver for a receiver for receiving a second control signal, the receiver with a gate driver, wherein there is a second on-chip high-voltage isolation device between the second receiver and the second transmitter, wherein the second die is attached by a conductive die attach material to the thermal pad, and wherein an area of the second die is within the pad area;
bond wires including bond wires between the first bond pads and the half-etched lead terminals, bond wires between the second bond pads and the second lead terminals, and die-to-die bond wires between the first bond pads and the second bond pads; and
a mold compound for encapsulating the first die and the second die;
a controller coupled to the converter input side and to the converter output side, wherein the controller is configured to:
sense a voltage level at an output of the converter output side, and
transmit an AC control signal to the converter output side that is transmitted across the high-voltage isolation device to the converter input side to control a voltage applied to gates of transistors of the converter input side to achieve a desired voltage regulation and a higher power conversion efficiency.

20. The telecom module of claim 19, wherein the telecom module is assembled on a single printed circuit board (PCB) that includes the high-voltage isolation device, wherein the converter input side comprises a full bridge converter, and wherein the at least one MCM package comprises a first MCM package and a second MCM package.

* * * * *